United States Patent
Oda

(10) Patent No.: US 8,344,265 B2
(45) Date of Patent: Jan. 1, 2013

(54) ELECTRONIC COMPONENT

(75) Inventor: Tetsuya Oda, Ishikawa-gun (JP)

(73) Assignee: Murata Manufacturing Co., Ltd., Kyoto (JP)

(*) Notice: Subject to any disclaimer, the term of this patent is extended or adjusted under 35 U.S.C. 154(b) by 200 days.

(21) Appl. No.: 12/825,524

(22) Filed: Jun. 29, 2010

(65) Prior Publication Data

US 2010/0252316 A1 Oct. 7, 2010

Related U.S. Application Data

(63) Continuation of application No. PCT/JP2009/050028, filed on Jan. 6, 2009.

(30) Foreign Application Priority Data

Jan. 17, 2008 (JP) .................................. 2008-008481

(51) Int. Cl.
*H05K 1/11* (2006.01)
(52) U.S. Cl. .................................. 174/261; 174/260
(58) Field of Classification Search .................. 174/260, 174/261; 361/767–779
See application file for complete search history.

(56) References Cited

U.S. PATENT DOCUMENTS

| | | | | |
|---|---|---|---|---|
| 5,969,461 A | * | 10/1999 | Anderson et al. | 310/313 R |
| 6,940,183 B1 | * | 9/2005 | Hwan | 257/787 |
| 2003/0090338 A1 | | 5/2003 | Muramatsu | |
| 2009/0027864 A1 | * | 1/2009 | Cho et al. | 361/767 |

FOREIGN PATENT DOCUMENTS

| | | |
|---|---|---|
| JP | 6-97634 A | 4/1994 |
| JP | 2002-111148 A | 4/2002 |
| JP | 2003-198325 A | 7/2003 |
| JP | 2003-282812 A | 10/2003 |

OTHER PUBLICATIONS

Official Communication issued in International Patent Application No. PCT/JP2009/050028, mailed on Mar. 10, 2009.

* cited by examiner

*Primary Examiner* — Jeremy Norris
(74) *Attorney, Agent, or Firm* — Keating & Bennett, LLP

(57) ABSTRACT

An electronic component achieves reduced variations in the mounting positions of elements even with variations in the size of solder bumps and easily supports finer pitches of the bumps. The electronic component includes a common substrate, at least two elements mounted on a first main surface of the common substrate, a conductive pattern provided on the first main surface of the common substrate so as to extend in a direction along which the at least two elements are disposed adjacent to each other and including a plurality of lands arranged at positions corresponding to terminals of the elements insulating films provided at least on the conductive pattern so as to be spaced apart from both side edges of the lands in a direction perpendicular or substantially perpendicular to a land extending direction and adjacent to both ends of the lands in the land extending direction, and solder bumps that are disposed on the lands and are arranged to connect the lands and the terminals of the elements.

6 Claims, 5 Drawing Sheets

ELECTRONIC COMPONENT

BACKGROUND OF THE INVENTION

1. Field of the Invention

The present invention relates to electronic components, and in particular, to electronic components including a plurality of elements mounted on common substrates via solder bumps.

2. Description of the Related Art

Various electronic components including a plurality of elements mounted on common substrates have been proposed.

For example, an electronic component shown in a cross-sectional view in FIG. 10 includes a surface acoustic wave filter 102 for reception and a surface acoustic wave filter 103 for transmission that are electrically connected to a multilayered ceramic substrate 101 using solder or gold bumps 105. The solder bumps are joined by reflowing, and the gold bumps are joined by ultrasonic bonding (for example, see Japanese Unexamined Patent Application Publication No. 2003-198325).

In general, when solder bumps are used, an insulating film $50x$ including openings $52x$ is provided on a conductive pattern $42x$ provided on a common substrate using a solder resist as shown in, for example, a plan view in FIG. 9, and portions of the conductive pattern $42k$ exposed through the openings $52x$ in the insulating film $50x$ define lands on the common substrate side used for the connection to elements $10a$, $10b$.

When the lands are defined by the conductive pattern exposed through the openings in the insulating film in this manner, the conductive film must be larger than the openings in the insulating film in view of displacements of the insulating film and the conductive pattern. This disadvantageously prevents finer pitches of the bumps, and restricts design flexibility.

Moreover, when the solder bumps melt during the reflow process, the solder bumps wet and spread while being trapped inside the openings in the insulating film, and the mounting height of the elements is reduced. Accordingly, the permissible range of variations in the size of the solder bumps depends on the size of the openings in the insulating film. When the size of the openings in the insulating film is increased, the permissible range of variations in the size of the solder bumps is increased. However, this leads to an increase in variations in the mounting positions of the elements. On the other hand, when the size of the openings in the insulating film is reduced, variations in the mounting positions of the elements are reduced. However, the permissible range of variations in the size of the solder bumps is reduced.

When the size of the bumps is reduced to achieve lower profiles and finer pitches, the size of the openings in the insulating film must be reduced. When the size of the openings is reduced, accuracy in processing the openings must be increased, and variations in the size of the openings must be reduced. This leads to difficulty in processing and an increase in cost.

SUMMARY OF THE INVENTION

To overcome the problems described above, preferred embodiments of the present invention provide an electronic component having reduced variations in the mounting positions of elements even with variations in the size of solder bumps and which easily supports finer pitches of the bumps.

A preferred embodiment of the present invention provides an electronic component including a common substrate, at least two elements mounted on a first main surface of the common substrate, a conductive pattern located on the first main surface of the common substrate and extending in a direction along which the elements mounted on the first main surface of the common substrate are disposed adjacent to each other and including a plurality of lands arranged at positions corresponding to terminals of the elements mounted on the first main surface of the common substrate, insulating films provided at least on the conductive pattern so as to be spaced apart from both side edges of the lands in a direction perpendicular or substantially perpendicular to the land extending direction and adjacent to both ends of the lands in the land extending direction, and solder bumps that are disposed on the lands and connect the lands and the terminals of the elements.

The direction along which the lands extend and the direction along which the elements mounted on the common substrate are disposed adjacent to each other are the same or substantially the same. Since the insulating films are disposed at both sides of the lands in the land extending direction and arranged so as to be spaced apart from both side edges of the lands in the direction perpendicular or substantially perpendicular to the land extending direction, the solder bumps can extend to spaces at both sides of the lands in the direction perpendicular or substantially perpendicular to the land extending direction during the reflow process. Therefore, the elements adjacent to each other can be mounted with a predetermined gap interposed therebetween even with variations in the size of the solder bumps.

The permissible range of displacements of the insulating films and the lands can be increased when portions of the conductive pattern adjacent to both ends of the lands in the land extending direction have a width equal or substantially equal to that of the lands and extend in the land extending direction. In order to reduce the pitch of the bumps, the dimensional accuracy of the insulating films in only the direction along which the elements are disposed adjacent to each other must be increased. Therefore, the bumps can be easily produced at a finer pitch with less design restrictions as compared to the case in which lands are formed using openings in an insulating film.

The insulating films preferably extend with predetermined gaps interposed between the insulating films and the side edges of the lands and preferably enclose the lands.

With this configuration, even when the mounting positions of the elements are shifted, the positions of the elements are not further shifted during subsequent handling as long as the solder bumps are disposed inside the insulating films that enclose the lands.

The gap between the insulating films and the side edges of the lands is preferably smaller than the diameter of the solder bumps.

In this case, the elements can be mounted in normal positions due to the self-alignment effect even when the mounting positions of the elements are shifted since the solder bumps are in contact with the lands during the reflow process.

The conductive pattern preferably includes an alignment mark portion extending parallel or substantially parallel to the land extending direction. The insulating films preferably include alignment mark ends provided at both sides of the alignment mark portion in the direction along which the alignment mark portion extends with a gap interposed therebetween. A portion of the alignment mark portion exposed through the gap between the alignment mark ends preferably defines an alignment mark.

In this case, both the lands and the alignment mark are shifted in the same direction by the same amount even when the relative positions of the conductive pattern and the insulating films are shifted. Therefore, the effects on the mounting accuracy of the elements can be effectively reduced.

The electronic component preferably further includes a resin disposed on the first main surface of the common substrate so as to cover the elements.

With this configuration, the size of the electronic component including the plurality of elements can be easily reduced.

The elements preferably include a surface acoustic wave filter for transmission and a surface acoustic wave filter for reception.

With this configuration, a small duplexer can be provided.

The electronic component according to preferred embodiments of the present invention has reduced variations in the mounting positions of the elements even with variations in the size of the solder bumps, and can easily support finer pitches of the bumps.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will now be described with reference to FIGS. 1 to 7.

First Preferred Embodiment

An electronic component 30 according to a first preferred embodiment of the present invention will be described with reference to FIGS. 1 to 4.

Figure 1:
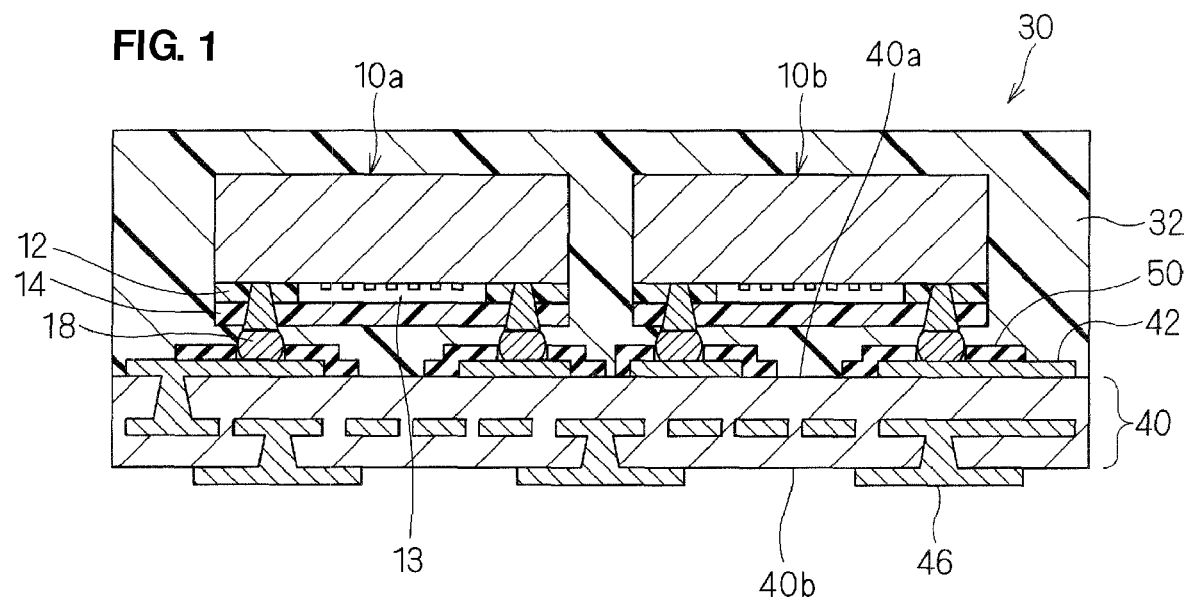
FIG. 1 is a cross-sectional view of an electronic component according to a first preferred embodiment of the present invention.

As shown in a cross-sectional view in FIG. 1, the electronic component 30 according to the first preferred embodiment includes two elements 10a, 10b mounted on a common substrate 40 on a side of the upper surface 40a defining a first main surface of the common substrate. That is, a conductive pattern 42 provided on the upper surface 40a of the common substrate 40 and the elements 10a, 10b are electrically connected to each other via solder bumps 18 interposed therebetween. A resin 32 is disposed over the elements 10a, 10b so as to cover the elements 10a, 10b. External electrodes 46 used to mount the electronic component 30 on, for example, other circuit boards are exposed on a side of the lower surface 40b defining a second main surface of the common substrate 40. Via conductors and internal wiring patterns that electrically connect the conductive pattern 42 and the external electrodes 46 are provided inside the common substrate 40. For example, the electronic component 30 may preferably be a duplexer, and may include the elements 10a, 10b defining surface acoustic wave filters for transmission and reception, respectively, mounted side by side on the common substrate 40.

Figure 2:
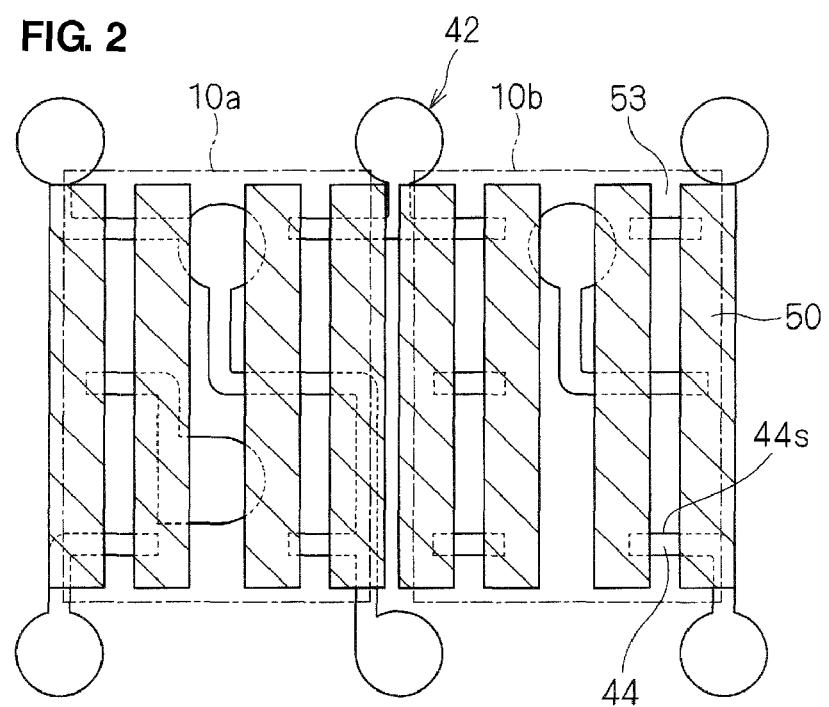
FIG. 2 is a plan view of a first main surface of a common substrate according to the first preferred embodiment of the present invention.
Figure 3:
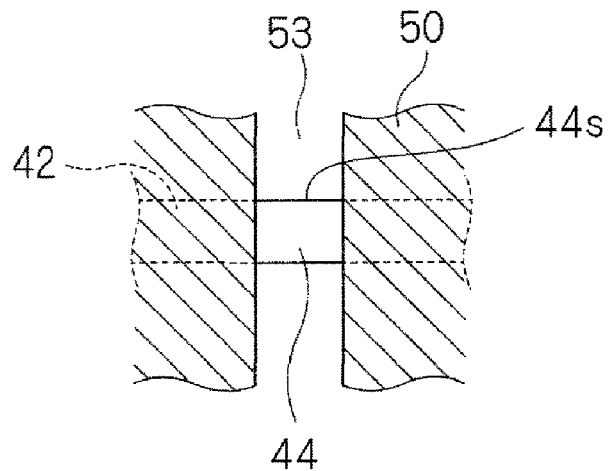
FIG. 3 is an enlarged plan view of a principal portion in the vicinity of a land according to the first preferred embodiment of the present invention.

As shown in a plan view in FIG. 2 and an enlarged plan view of a principal portion in FIG. 3, the conductive pattern 42 is provided on the upper surface 40a of the common substrate 40, and insulating films 50 indicated by hatched areas are provided on the common substrate 40 and the conductive pattern 42 using a solder resist. Slits 53 are provided between the insulating films 50, and portions of the conductive pattern 42 exposed through the slits 53 define lands 44 to be connected to solder bumps 18. The lands 44 extend in a direction along which the elements 10a, 10b are mounted on the upper surface 40a of the common substrate 40 adjacent to each other, that is, in an X direction (the left-right direction in FIGS. 2 and 3). The slits between the insulating films 50 extend in a direction perpendicular or substantially perpendicular to the direction along which the lands 44 extend (X direction), that is, in a Y direction, and the insulating films 50 are arranged so as to be spaced apart from side edges 44s at both sides of the lands 44 in the Y direction.

When the lands 44 extending in the X direction are exposed through the slits 53 between the insulating films 50 extending in the Y direction, displacements of the elements 10a, 10b in the X direction are reduced as compared to those in the Y direction even when the positions of the elements 10a, 10b are shifted by, for example, uneven wettability due to, for example, displacements in the mounting positions of the elements 10a, 10b and variations in the size of the solder bumps 18. This allows the gap between the elements 10a, 10b disposed adjacent to each other in the X direction to be reduced, and leads to a reduction in the size and cost of the product.

In addition, mounting failure of the elements 10a, 10b is unlikely to occur even when the conductive pattern 42 and the insulating films 50 are not accurately positioned since the pitch of the lands 44 does not change.

In addition, the insulating films 50 are arranged so as to be spaced apart from the side edges 44s of the lands 44, and the solder bumps 18 can extend to spaces in the Y direction during the reflow process. Therefore, connection reliability of the elements 10a, 10b is significantly improved as compared to the case in which solder bumps are disposed inside closed spaces of openings in an insulating film since stress is not easily applied to the solder bump 18.

Next, a specific manufacturing procedure will be described with reference to FIGS. 1 and 2.

Piezoelectric elements, each including at least one vibrating portion and element wiring lines connected to the vibrating portion disposed on a piezoelectric substrate 11, are prepared as the elements 10a, 10b. In order to form hollow spaces 13, a supporting layer 12 is formed so as not to overlap the vibrating portions. The supporting layer 12 can preferably be made of a photosensitive polyimide resin, for example. A cover layer 14 is formed on the supporting layer 12 by, for example, lamination, and via holes are formed using a laser, for example. The cover layer 14 can preferably be composed of a non-photosensitive epoxy resin, for example. Subsequently, an under-bump metal layer 17 is formed by electrolytic plating, for example, of Cu or Ni, and Au preferably having a thickness of about 0.05 μm to about 0.1 μm for antioxidation is formed on the surface. Solder paste, such as Sn—Ag—Cu, for example, is preferably printed above the under-bump metal layer 17 with a metal mask interposed therebetween, and is heated at a temperature of, for example, about 260° C., at which the solder paste melts so that the solder is fixed to the under-bump metal layer 17. Flux is then removed using a flux cleaner. In this manner, the spherical solder bumps 18 are formed. Subsequently, chips are cut out by, for example, dicing, and the preparation of the elements is completed.

In order to manufacture the common substrate 40, the conductive pattern 42 is preferably formed on the surface 40a by etching Cu foil, for example, using a conventional method for manufacturing printed wiring boards, and the insulating films 50 are formed on the pattern by photolithoetching using a solder resist. Subsequently, Ni having a thickness of about 3 μm to 6 μm, for example, and Au having a thickness of about 0.05 μm to about 0.1 μm, for example, for antioxidation of the surface of the conductive pattern are formed on the pattern by electroless plating.

The conductive pattern 42 and the insulating films 50 are formed such that the lands 44 formed by the conductive pattern 42 and the insulating films 50 on the surface 40a of the printed wiring board extend in the direction along which the two elements 10a, 10b are disposed adjacent to each other, that is, in the X direction as shown in FIG. 2.

Next, as shown in FIGS. 1 and 2, the elements 10a, 10b are mounted on the lands 44 on the surface 40a of the printed wiring board and are embedded in the resin 32. Finally, the printed wiring board is divided into the plurality of electronic components 30.

Figure 4:
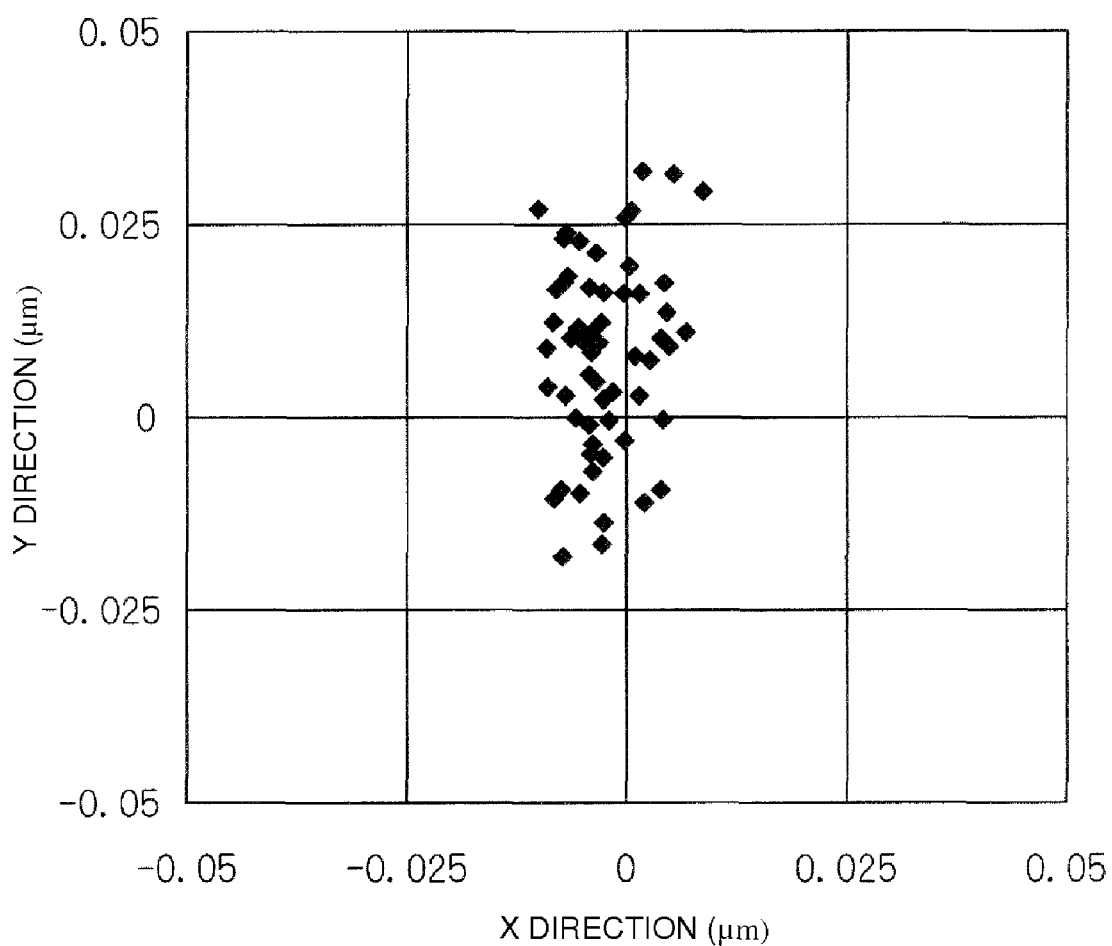
FIG. 4 illustrates variations in mounting positions in X and Y directions in the first preferred embodiment of the present invention.

FIG. 4 illustrates measurement results of the mounting positions of the elements 10a, 10b, that is, variations in the mounting positions of the elements before the elements 10a, 10b were embedded in the resin 32. Table 1 shows the average, standard variation, maximum, and minimum values of the measured values shown in FIG. 4.

TABLE 1

|  | X direction | Y direction |
| --- | --- | --- |
| Average | −0.002 | 0.008 |
| σ | 0.005 | 0.012 |
| Maximum | 0.009 | 0.032 |
| Minimum | −0.010 | −0.018 |

As shown in FIG. 4 and Table 1, variations in the mounting positions in the X direction were reduced to a greater extent than those in the Y direction. This may be because the solder bumps 18 could extend more freely in the Y direction than in the X direction during the reflow process since the insulating films 50 were not formed at both sides of the lands 44 in the Y direction while the insulating films 50 were formed at both ends of the lands 44 in the X direction.

Second Preferred Embodiment

An electronic component according to a second preferred embodiment of the present invention will now be described with reference to FIG. 5.

The electronic component according to the second preferred embodiment has the same or substantially the same structure as the electronic component 30 according to the first preferred embodiment, except for the following additional structures.

Figure 5:
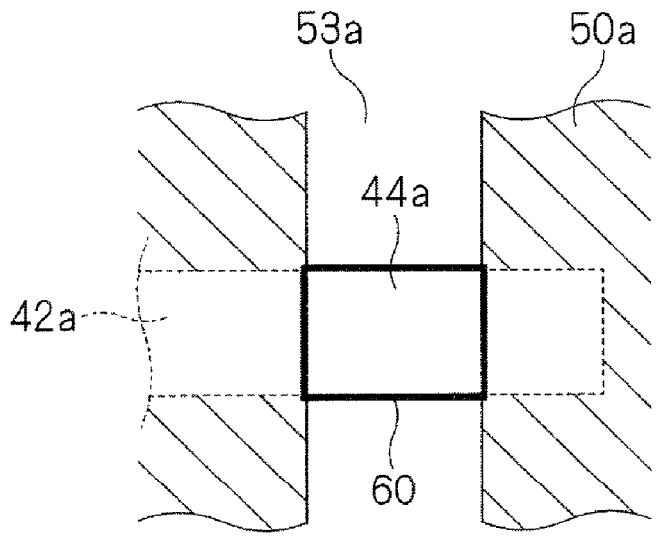
FIG. 5 is an enlarged cross-sectional view of a principal portion in the vicinity of an alignment mark according to a second preferred embodiment of the present invention.

As shown in an enlarged plan view of a principal portion in FIG. 5, the conductive pattern includes alignment mark portions 42a extending in the X direction. The insulating films include alignment mark ends 50a provided at both sides of the alignment mark portions 42a in a direction along which the alignment mark portions extend with gaps 53a interposed therebetween. In this manner, alignment marks 44a are defined by portions of the alignment mark portions 42a of the conductive pattern exposed through the gaps 53a between the alignment mark ends 50a of the insulating films as indicated by thick lines 60.

Both of the portions for the alignment marks and the portions for the lands are provided in the conductive pattern and the insulating films at the same time.

When the alignment marks 44a used for mounting have the same structure as the lands as described above, both of the lands and the alignment marks are shifted in the same direction by the same amount even when the relative positions of the conductive pattern and the insulating films are shifted. Therefore, adverse effects on the mounting accuracy of the elements are prevented and minimized.

Third Preferred Embodiment

Figure 6:
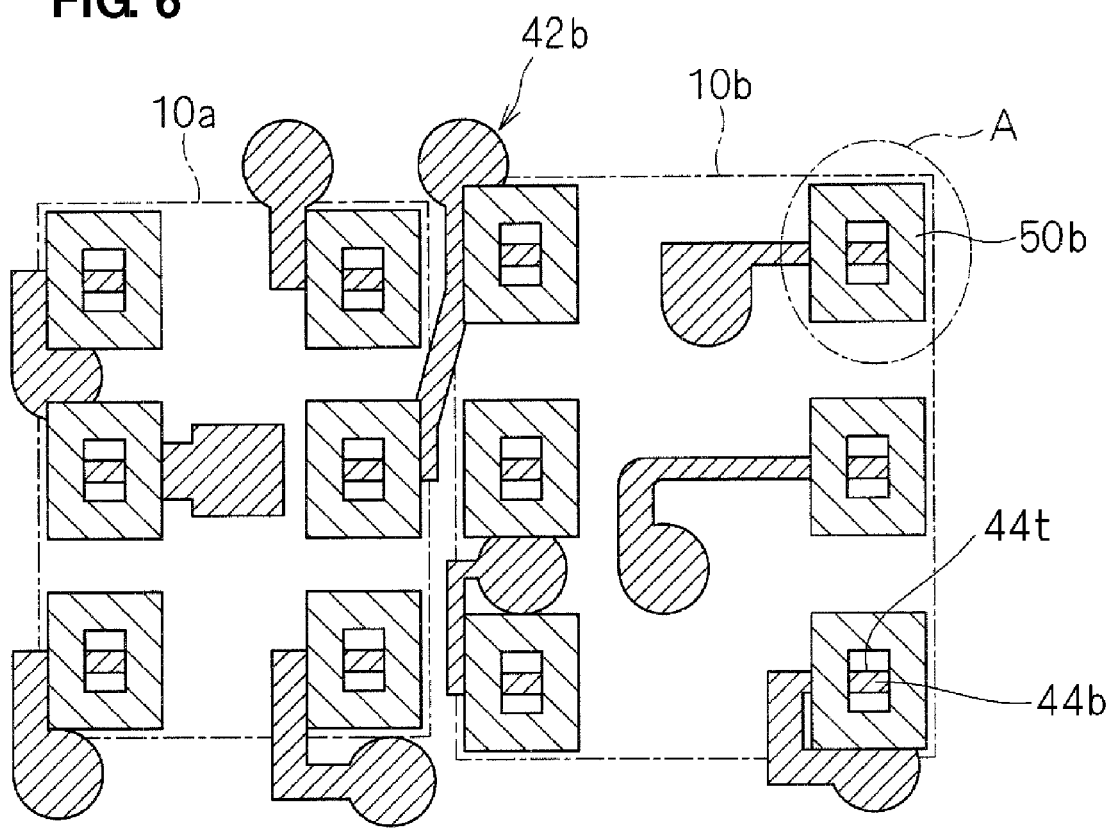
FIG. 6 is a plan view of a first main surface of a common substrate according to a third preferred embodiment of the present invention.
Figure 7:
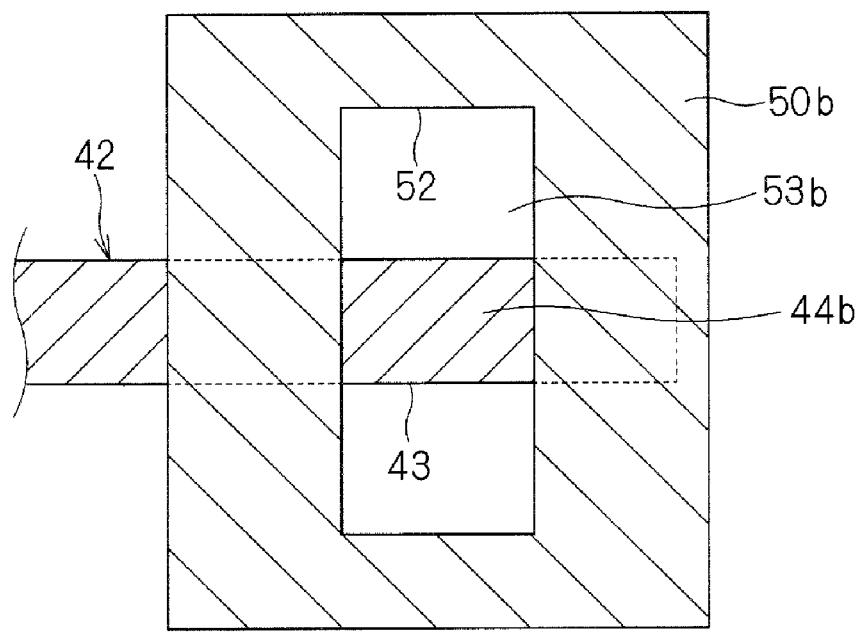
FIG. 7 is an enlarged plan view of a principal portion in the vicinity of a land according to the third preferred embodiment of the present invention.

An electronic component according to a third preferred embodiment of the present invention will now be described with reference to FIGS. 6 to 8.

The electronic component according to the third preferred embodiment has substantially the same structure as the electronic component according to the first preferred embodiment. Differences between the third preferred embodiment and the first preferred embodiment will now be described with particular emphasis using the same reference signs for components common as those in the first preferred embodiment.

In the electronic component according to the first preferred embodiment, the insulating films 50 extending in the Y direction are arranged in the X direction, and are not provided at both sides of the lands 44 in the Y direction. In contrast, as shown in a plan view in FIG. 6 and an enlarged plan view of a principal portion in FIG. 7, the principal portion being indicated by a reference sign A in FIG. 6, insulating films 50b are also provided at both sides of lands 44b in the Y direction with gaps interposed between the insulating films and side edges 44t of the lands 44b in the electronic component according to the third preferred embodiment. That is, a rectangular frame-shaped insulating film 50b is provided for each land 44b so as to enclose the land 44b.

Figure 8:
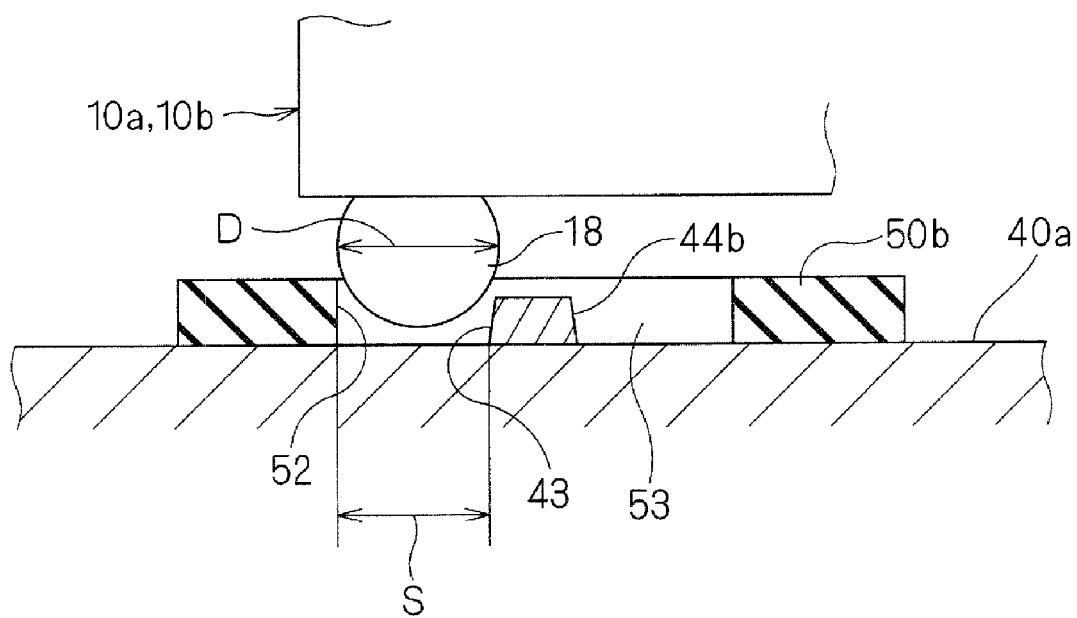
FIG. 8 is an enlarged cross-sectional view of a principal part in the vicinity of a land according to the third preferred embodiment of the present invention.
Figure 9:
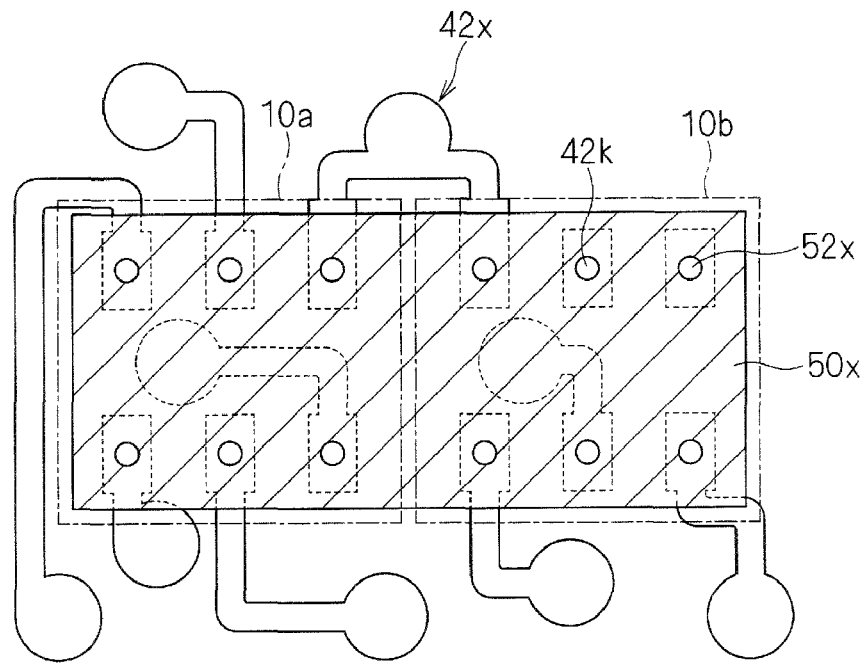
FIG. 9 is a plan view of a common substrate according to the related art.
Figure 10:
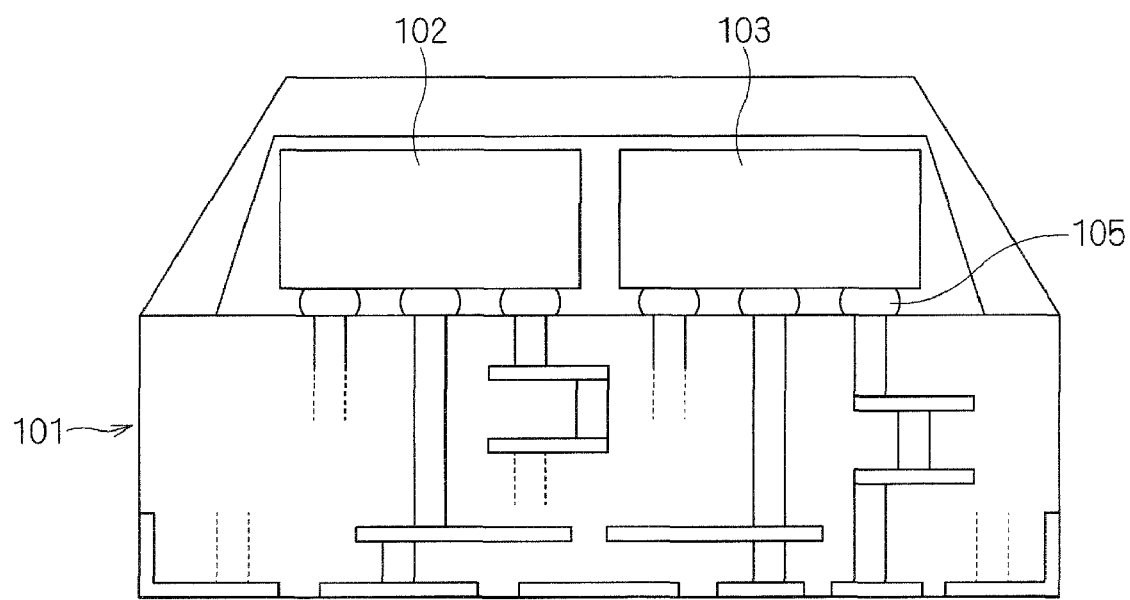
FIG. 10 is a cross-sectional view of a known electronic component.

As shown in an enlarged cross-sectional view of a principal portion in FIG. 8, the gap (S) between a side edge 43 of a land 44b and an inner surface 52 of an insulating film 50b is preferably smaller than the diameter (D) of a solder bump 18. When S<D is satisfied, the solder bump is prevented from being moved by the insulating film 50b as long as the solder bump is positioned in an opening 53b enclosed by the insulating film 50b even when the mounting positions of the elements 10a, 10b are shifted. Therefore, the positions of the elements are not significantly shifted by, for example, handling. When the solder balls melt during the subsequent reflow process, the elements 10a, 10b can be mounted in normal positions due to the self-alignment effect caused by the surface tension of the solder.

When the insulating films are provided at both sides of the lands, which extend in the direction along which the elements are disposed adjacent to each other, in the direction along which the lands extend and the elements are mounted using the solder bumps as described above, variations in the mounting positions of the elements can be reduced regardless of the variations in the size of the solder bumps. Thus, finer pitches can be easily provided.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An electronic component comprising:
   a common substrate;
   at least two elements mounted on a first main surface of the common substrate and arranged adjacent to each other on the first main surface of the common substrate along a first direction;
   a conductive pattern provided on the first main surface of the common substrate and including a plurality of lands arranged so as to extend in the first direction along which the at least two elements mounted on the first main surface of the common substrate are arranged adjacent to each other, the plurality of lands being disposed at positions corresponding to terminals of the at least two elements mounted on the first main surface of the common substrate;
   insulating films provided at least on the conductive pattern so as to be spaced apart from and not in contact with both side edges of the lands in a direction perpendicular or substantially perpendicular to a land extending direction and adjacent to and in contact with both ends of the lands in the land extending direction; and
   solder bumps disposed on the lands and arranged to connect the lands and the terminals of the elements.

2. The electronic component according to claim 1, wherein the insulating films are arranged to extend with predetermined gaps interposed between the insulating films and the side edges of the lands and to enclose the lands.

3. The electronic component according to claim 2, wherein the gaps between the insulating films and the side edges of the lands are smaller than a diameter of the solder bumps.

4. The electronic component according to claim 1, wherein
   the conductive pattern includes an alignment mark portion extending parallel or substantially parallel to the land extending direction;
   the insulating films include alignment mark ends provided at both sides of the alignment mark portion in a direction along which the alignment mark portion extends with a gap interposed therebetween; and
   a portion of the alignment mark portion exposed through the gap between the alignment mark ends defines an alignment mark.

5. The electronic component according to claim 1, further comprising a resin arranged on the first main surface of the common substrate so as to cover the at least two elements.

6. The electronic component according to claim 1, wherein the at least two elements include a surface acoustic wave filter for transmission and a surface acoustic wave filter for reception.

* * * * *